(12) United States Patent
Tsironis

(10) Patent No.: US 6,998,836 B2
(45) Date of Patent: Feb. 14, 2006

(54) LOW LOSS INTEGRATION OF WAFER PROBES WITH MICROWAVE TUNERS

(76) Inventor: Christos Tsironis, 44 Caribou Crescent, Montreal (CA), H9J 2H8

( * ) Notice: Subject to any disclaimer, the term of this patent is extended or adjusted under 35 U.S.C. 154(b) by 278 days.

(21) Appl. No.: 10/338,866

(22) Filed: Jan. 9, 2003

(65) Prior Publication Data

US 2003/0132759 A1 Jul. 17, 2003

Related U.S. Application Data

(60) Provisional application No. 60/346,300, filed on Jan. 9, 2002.

(51) Int. Cl.
*G01R 23/00* (2006.01)

(52) U.S. Cl. .................. 324/95; 324/149; 324/758; 333/33; 333/260

(58) Field of Classification Search ............... 333/231, 333/33, 34, 260, 245, 246; 324/95, 149, 758, 324/76.11, 76.1
See application file for complete search history.

(56) References Cited

U.S. PATENT DOCUMENTS 5,570,068 A * 10/1996 Quan ........................ 333/33
6,515,465 B1 * 2/2003 Kiyokawa et al. ....... 324/76.49

* cited by examiner

*Primary Examiner*—Stephen E. Jones

(57) ABSTRACT

This invention relates to the reduction of insertion losses and by consequence maximization of reflection factors for on-wafer load pull testing of high power or low noise transistor chips, using as much a direct integration as possible between the slotted airline of the tuners and low loss probes, said probes being either modified commercial probes or probes made as an extension of the tuner slotted airline itself.

3 Claims, 7 Drawing Sheets

Assembly of contact cylinder and coaxial connector of probe

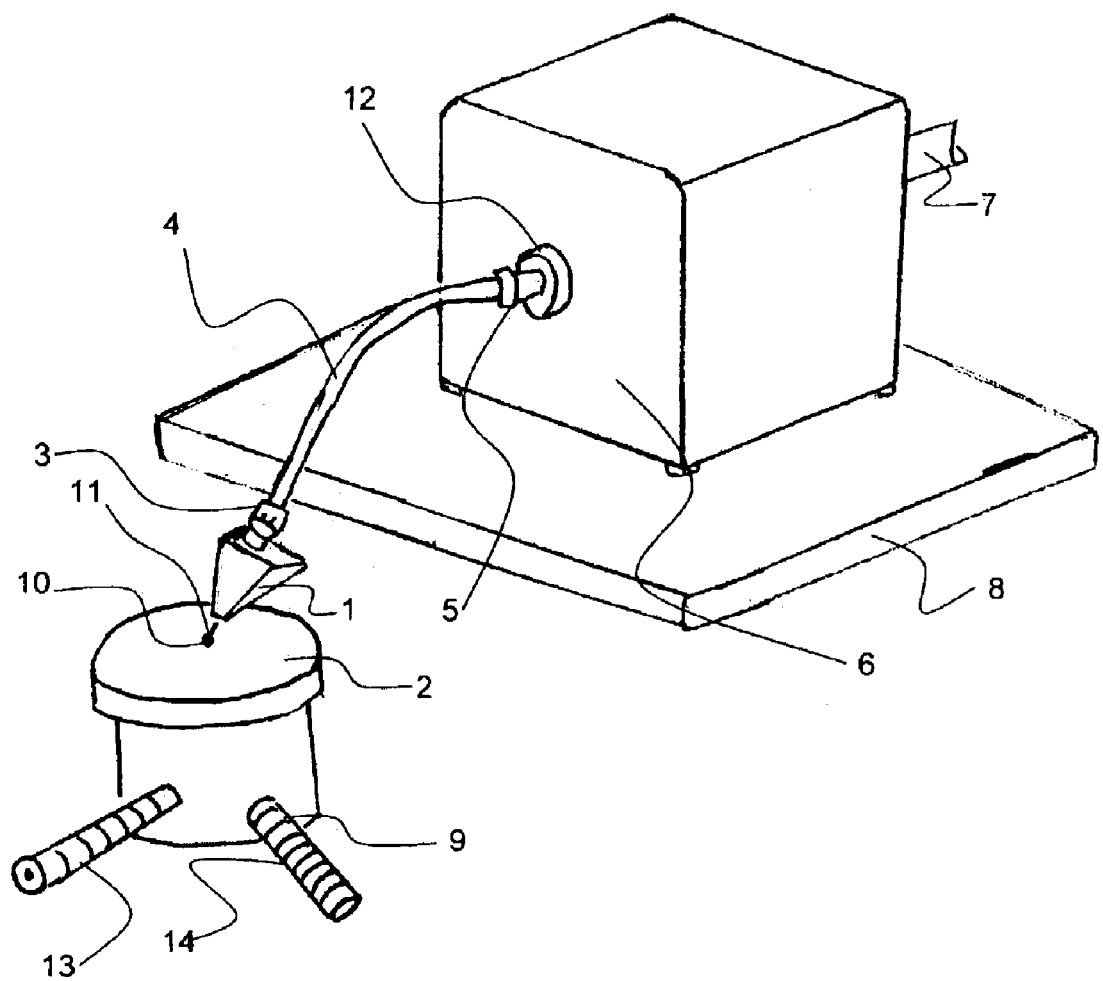
FIG. 1. Prior Art: On wafer load pull set-up

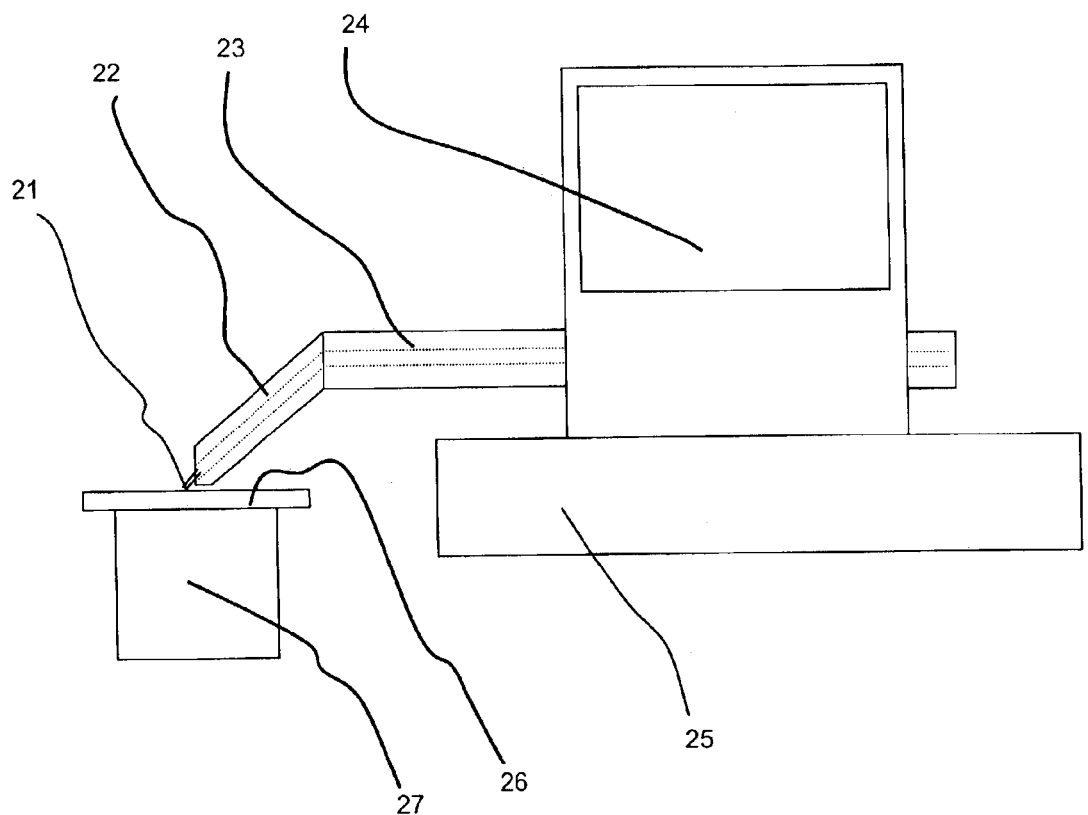
FIG. 2: Integration of wafer probe with microwave tuner using extended (23) and 45° bent (22) slotted airline

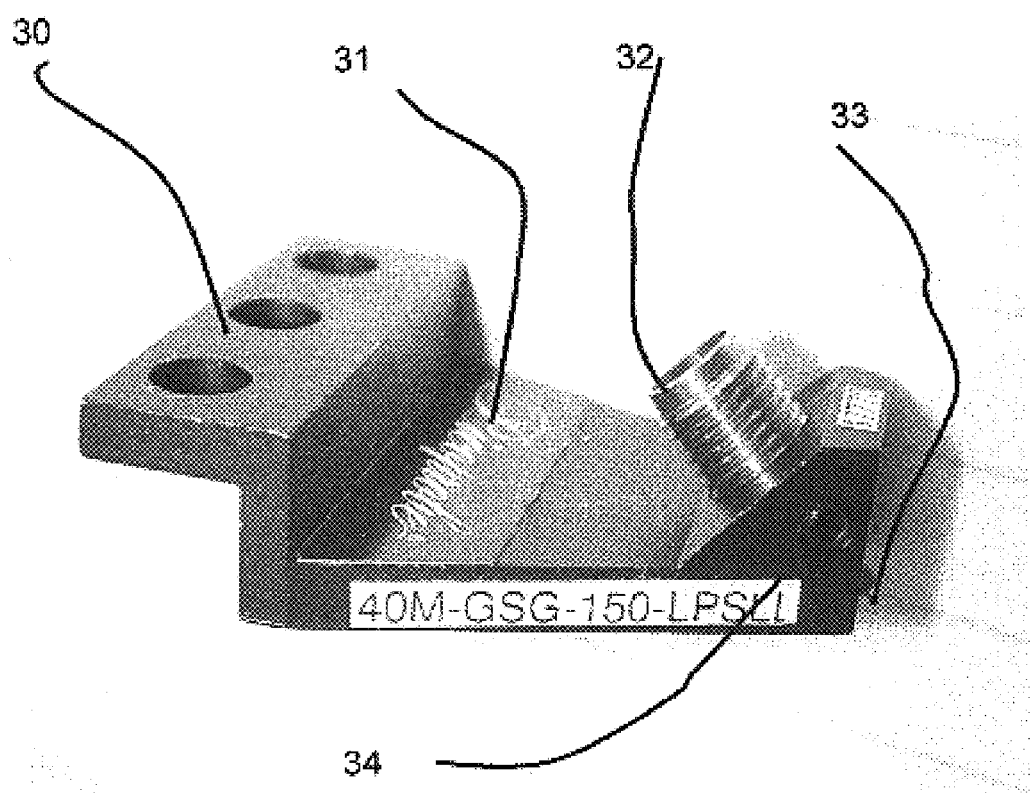
FIG. 3: Prior Art - Commercially available coaxial wafer probe

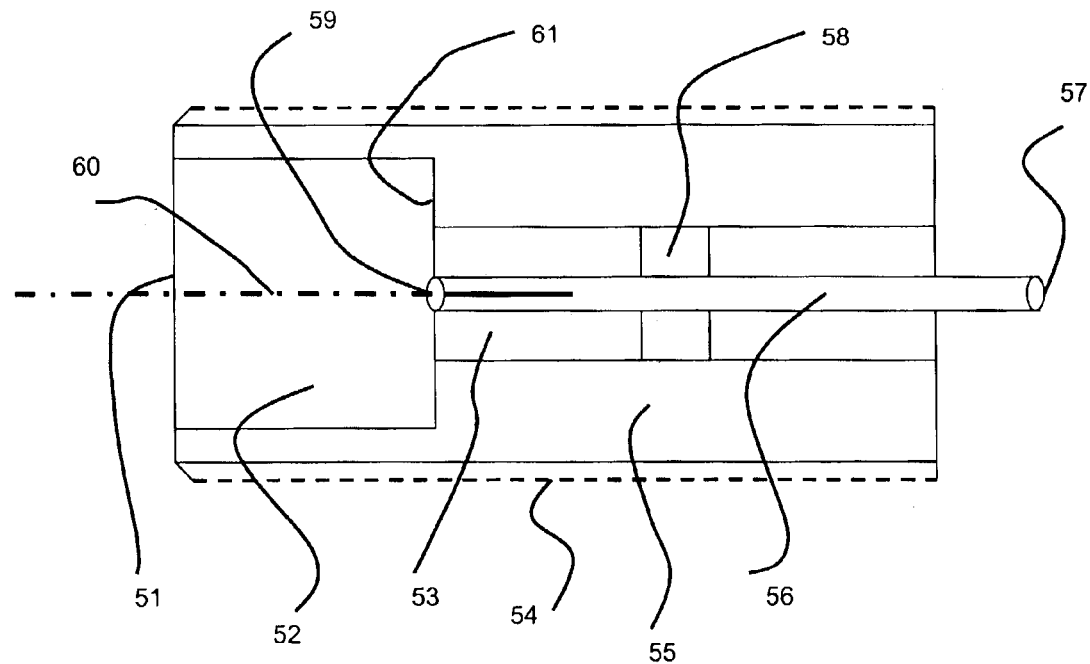
FIG. 4: Cross section of coaxial connector (32) of wafer probe
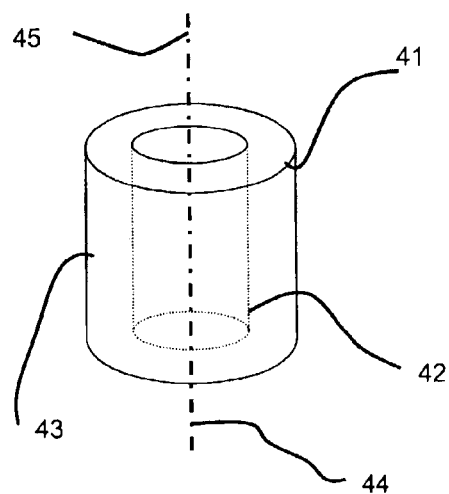
FIG. 5: Metallic cylinder for adapting a slabline to a coaxial probe

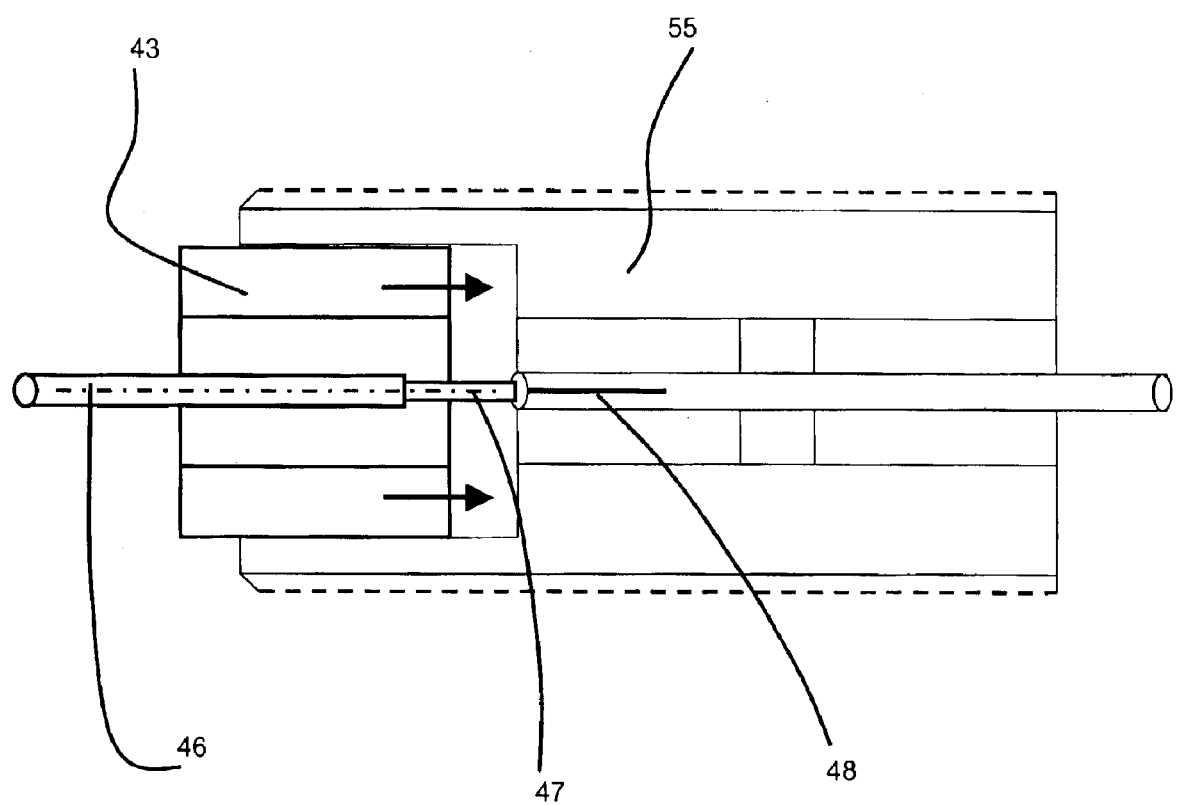
FIG. 6: Assembly of contact cylinder and coaxial connector of probe

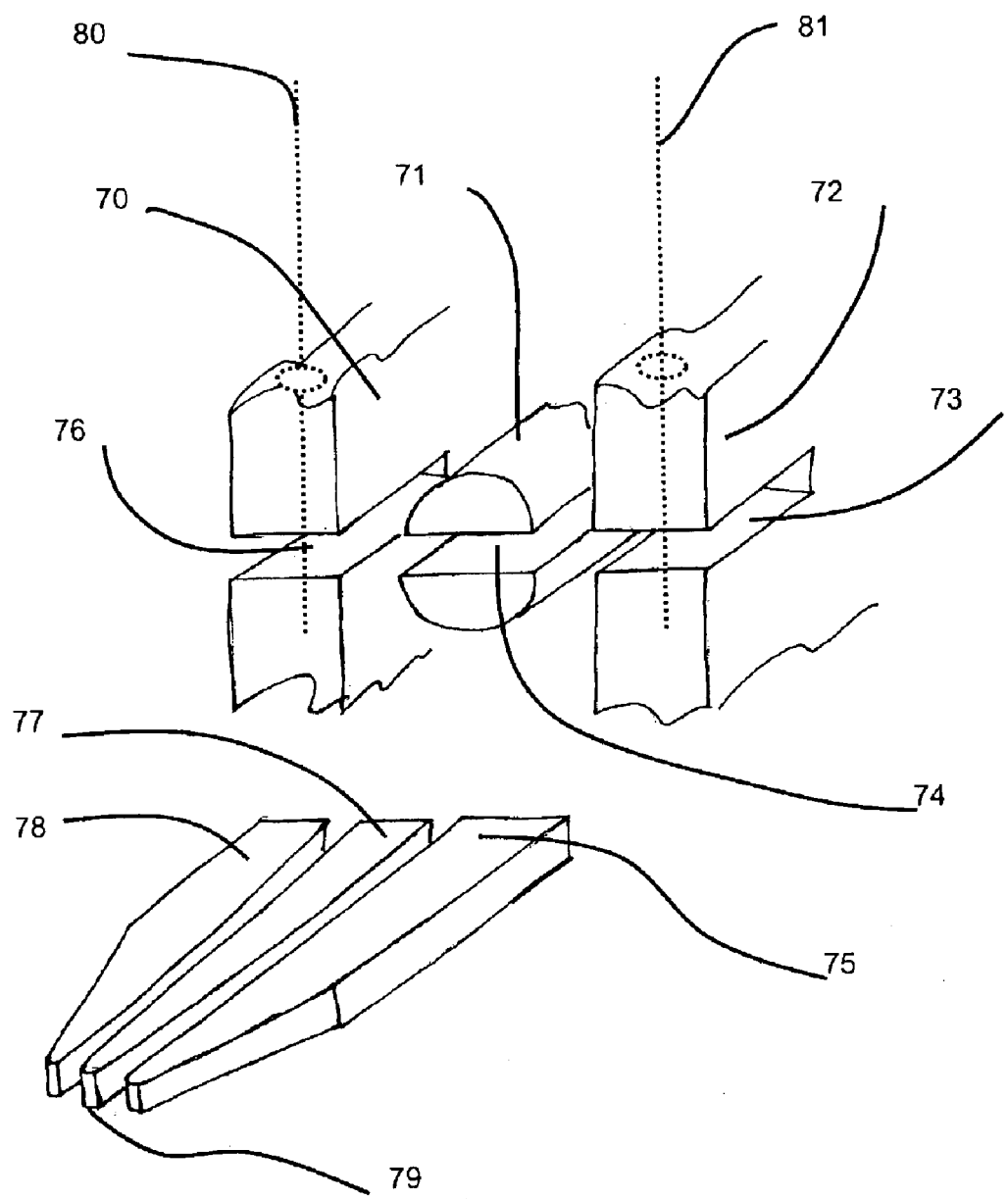
FIG. 7: Preparation and assembly of coplanar probe and tuner slabline

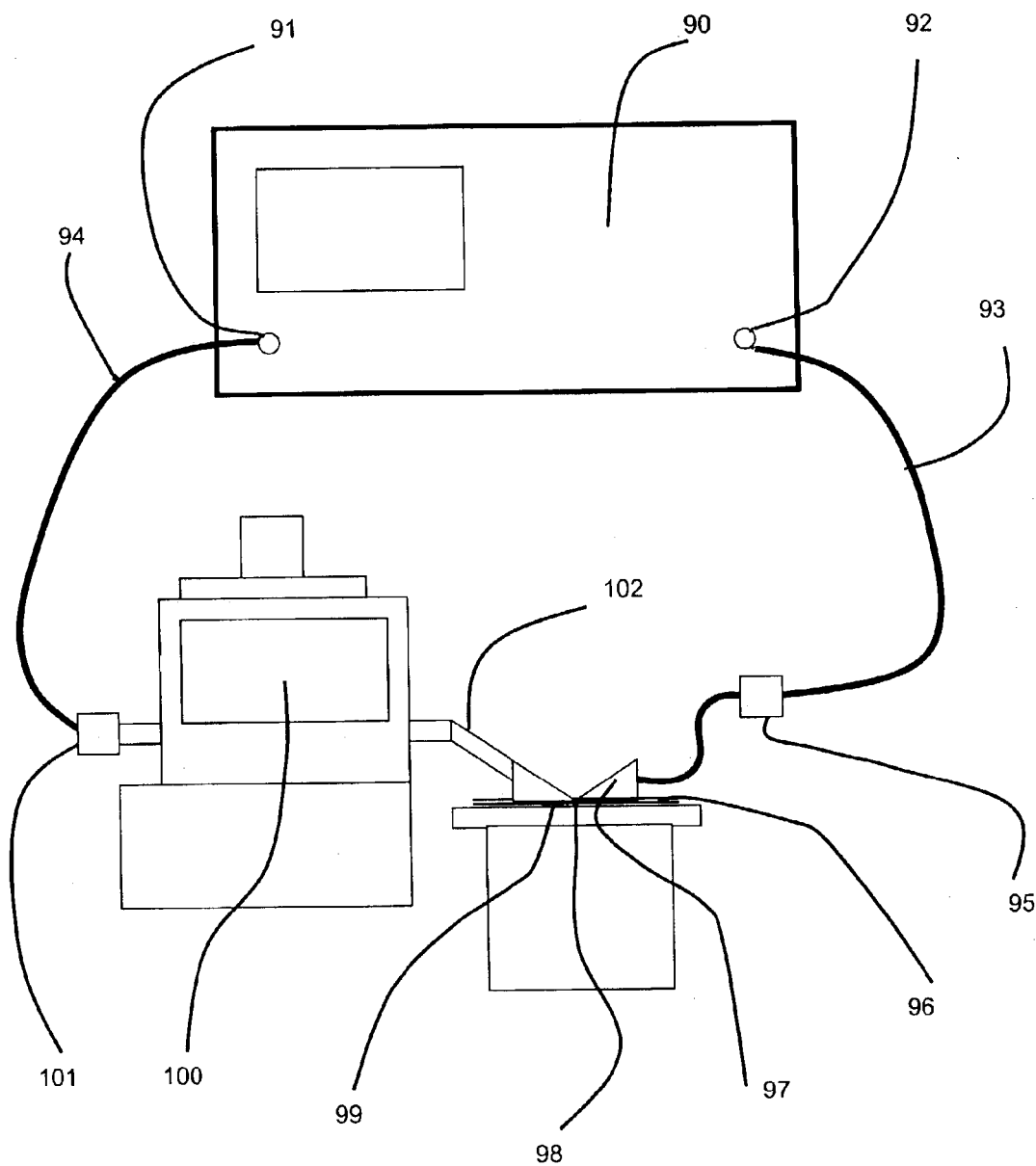
FIG. 8: Setup for calibrating a microwave tuner with integrated wafer probes.

LOW LOSS INTEGRATION OF WAFER PROBES WITH MICROWAVE TUNERS

PRIORITY CLAIM

This application claims benefit of priority of U.S. Provisional Application Ser. No. 60/346,300 filed on Jan. 9, 2002 entitled Low Loss Integration of Wafer Probes with Microwave Tuners, whose inventor was Christos TSIRONIS.

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Field of the Invention

This invention relates to the reduction of insertion losses on a high frequency measurement system for load pull and noise testing of very low or very high internal impedance transistors. The test system consists of microwave load pull tuners, a wafer probe station and associated wafer probes, used in testing transistor and integrated circuit chips on-wafer.

2. Description of the Prior Art

On wafer load pull testing is important for R&D and production-run characterization of power transistor chips. Alternative solutions to wafer probing, like slicing and separating wafer chips individually and mounting (attaching and wire-bonding) them on alumina ($Al_2O_3$) dyes for testing is time consuming, expensive, destructive and inaccurate (due to the fact that wire bonding from an alumina substrate to a chip is difficult to characterize and to reproduce between different samples and between calibration and testing). As transistor chip size (total gate width) becomes larger in order to provide more RF power, the internal impedance of these transistors becomes very low (less than 1Ω) and has to be matched using microwave tuners. A similar situation occurs for very small and low noise transistors, where the internal impedance is very high (more than 2.5 kΩ). In both cases the corresponding reflection factors are very high and close to 1.

Presently, internal impedances of less than 1Ω have to be characterized. The actual status of load pull wafer probing equipment (including tuners, tuner-probe connections and probes) does not allow this because of the insertion losses introduced by the probes and the tuner-probe interconnections.

Whereas state of the art high reflection tuners allow impedances of less than 0.5Ω to be synthesized at the tuner reference plane, the losses of the probes and interconnections result in an impedance of 1.5Ω or more at DUT (device under test) reference plane. This deterioration corresponds to approximately a 0.25 dB insertion loss between the probe tip and the tuner test port, due to the probe loss itself and the interconnections between the probe and the tuner.

A typical load pull set-up configuration is shown in FIG. 1 (prior art).

The microwave tuner (6) is placed on the table of the wafer probe station (8) as close to the DUT (10) as allowed by other accessories of the probe station, like the microscope, which is needed to view the transistor chips and the wafer probes (11). The test port (12) of the tuner is connected at the junction (5) via a semi rigid or flexible RF cable (4) with the wafer probe head (1) at the junction point (3). The probe itself is supported by some auxiliary micropositioners, not shown here, as they do not interfere with the RF behavior of the set-up.

Insertion losses incur at all points of the transmission structure starting at the tuner test port (12) and ending at the probe tip (11). Most of the losses (and residual reflections) occur at interconnections (5) and (3) because these interconnections include dielectrically filled support washers for the central connector pins, inside the dielectrically loaded coaxial cable (4) and inside the probe (1) at the point where the probe connector (3) transits over to an air-coplanar transmission line or a coaxial cable of the probe, depending on the nature of the probe used.

On wafer load pull testing of high power or low noise transistor chips is limited because the existing set-ups using passive electromechanical or electronic tuners cannot reach the reflection factors at DUT (device under test) reference plane, as required in order to effectively match the DUT. This "tuning range" limitation has a number of possible reasons:

1. Insufficient reflection amplitude tuning range of tuners
2. Lossy interconnections between tuners and wafer probes
3. Lossy wafer probes.

Item 1., the insufficient tuning range of the tuners, is not the subject of this patent and has been addressed elsewhere.

Experiments have shown that it is not possible to tune to microwave impedances below 1.5 to 2Ω at DUT reference plane using commonly available, passive, 50Ω based on-wafer load pull test systems, and this is increasingly insufficient for load pull testing of current medium power transistor chips.

BRIEF SUMMARY OF THE INVENTION

In order to solve the problems referred to in 'BACKGROUND TO THE INVENTION' with regards to the tuning range limitation we propose the following solutions:

The present patent deals only with lossy interconnections between the tuners and the probes and the losses of the probes themselves.

By eliminating most or all of these losses we propose to improve the reflection factor, which can be synthesized at DUT reference plane to values between 0.5Ω and 1Ω.

In order to solve the problem of lossy interconnections, a direct integration between the tuner airline and a low loss wafer probe is proposed. This way most of the lossy adapters and RF transitions between the tuner and the DUT are eliminated, allowing the maximum possible reflection factor available from a passive tuning system to be effective to the DUT reference plane.

The direct interconnection is established by extending the slotted airline (or "slabline") of the tuners outside the tuner body; then the DUT-close end of the slabline is prepared and machined in such a way as to be able to be connected directly with a coplanar or a coaxial wafer probe.

The problem associated with probe losses can be addressed by using low loss probes, preferably air-coplanar or very short and very low loss coaxial probes, i.e., structures with as little dielectric material as possible and as large dimensions as possible for the operation frequency in question, in order to reduce insertion loss, since it is known that RF loss is inversely proportional to the size of the transmission structures, because of the reduced current density, and proportional to the dielectric loss of the material used in coaxial cables.

BRIEF DESCRIPTION OF SEVERAL VIEWS OF THE DRAWING

The invention and its mode of operation will be more clearly understood from the following detailed description when read with the appended drawings in which:

FIG. 1 depicts Prior Art illustrating On wafer load pull set-up.

FIG. 2 illustrates the integration of a wafer probe with a microwave tuner using an extended and 45 degree bent slotted airline.

FIG. 3 depicts a typical commercially available coaxial wafer probe

FIG. 4 illustrates the cross section of a coaxial connector of a wafer probe

FIG. 5 depicts a metallic cylinder for adapting a slabline to a coaxial probe.

FIG. 6 illustrates the assembly of the contact cylinder and the coaxial connector of the probe.

FIG. 7 illustrates the preparation and assembly of a coplanar probe and a tuner slabline.

FIG. 8 illustrates the set-up for calibrating a microwave tuner with integrated wafer probes.

DETAILED DESCRIPTION OF THE INVENTION

This invention is described in the following description with reference to the FIGS. in which like numbers represent the same or similar elements.

In order to be able to integrate a wafer probe with a microwave tuner we must first extend the slotted airline (slabline) of the tuner such as to be able to reach the wafer probe directly, without having to use any auxiliary extension items (3), FIG. 1.

For this we extend the slotted airline of the tuner outside the tuner body in one piece; it is important to extend the slotted airline in a single piece. If the extension would be made of a different piece of transmission line, we would have to use adapters and these adapters would introduce insertion loss, thus jeopardizing any benefits. For integration with a probe we propose also to use a bent structure (22, 23), such as to be able to connect in a single piece of transmission line straight from the axis of the airline (22) to the axis of the probe (21). Typically an angle of 45° is used, but 30° and 90° angles are also used by wafer probe manufacturers (FIG. 3) and would require correspondingly bent airline structures.

Once the slotted airline (22) has reached the level of the wafer probe (21), and its axis direction coincides with the nominal probe axis ((32) FIG. 3) we join both components, i.e. probe and slotted airline, depending on the structure of the probes in the following manner: If the probe is coaxial we use the method described below as method 1. If the probe is coplanar we use the method described below as method 2.

Methods for connecting slotted airlines with wafer probes:

Method 1: Connecting Coaxial Probes:

A commercially available coaxial probe has a structure as shown in FIG. 3. It includes a metallic body (31,34), a coaxial connector (32) and a probe tip (33). The holes (30) are used to mount the probe on a standard probe positioner (not shown here), which is fixed on the table of the probe station. Even though it is possible to form the slotted airline such as to be able to fit into the probe structure as shown in FIG. 3 and reach the coaxial connector, it is preferable to remove the body of the probe (31, 34) from the probe itself by releasing the set screw (35) or other means used for fixation and use only the core of the probe itself (32–33).

A typical cross section of the remaining coaxial connector is shown in FIG. 4. In this case the assembly method proposed is as follows:

The end of the slotted airline is machined with an internal thread in order to be able to receive and screw on the outside thread (54) of the barrel (55) of the coaxial connector of the probe. The RF contact between the coaxial connector (51) and the sidewalls of the slotted airline is made using a metallic cylinder (43), FIG. 5, with an inner diameter (42) equal to the inside diameter of the coaxial connector (53) and an outside diameter (41) equal to the inside diameter of the coaxial connector barrel (52) (FIG. 4). The metallic cylinder (43) shall be made of good conducting material, such as gold- or silver-plated brass or copper in order to reduce RF loss. The cylinder (43) is inserted into the coaxial connector (55) in such a manner that the axis (44–45) aligns with the axis (60) of the connector. The central conductor of the slotted airline (23, 46) of the tuner (24) is then extended beyond the end of the airline body (22) by a length equal to the length of the metallic cylinder (43) and is shaped such (47) as to be able to enter into the slotted hole (48) of the central conductor (56) of the coaxial connector (55), FIGS. 4 and 6. This way a perfect extension and coaxial RF contact between the inner flange (61) of the coaxial connector and the front surface of the slotted airline (22) is established.

Another method for achieving this goal is to machine-off the material (52) of the coaxial connector beyond the surface (61) and to establish a direct contact at this plane. However experimental results show this method to be more labor-intensive, less reproducible and less precise than the method, which uses the above-mentioned cylinder block (43) as an interface.

Method 2: Connecting Coplanar Probes:

Coplanar wafer probes must be inserted into the front surface of the slotted airline directly, in order to take advantage of the low loss transition and eliminate all adapters, connectors and Teflon filled support washers and the associated loss. This can be done by properly preparing the front surface of the slotted airline as shown in FIG. 7.

The front end of the slotted airline, standing outside of the tuner body by a length as required to reach close to the wafer probe (here the extension is proposed in form of a slabline, but this does not exclude other forms) is shown as a block of items (70–71–72–73–74–76).

The slabline walls (70, 72) are slotted (73, 76) in the direction of the central conductor (71). The central conductor (71) is also slotted (74). The central conductor (71) and the sidewalls (70, 72) of the slabline have to be reduced in diameter and distance from each other in order to fit with the dimensions of the coplanar wafer probe shown here as a block of items (75–77–78–79). This can be done by keeping the ratio of the diameter of the central conductor (71) to the distance between the two sidewalls (70) and (72) constant, at a value corresponding to the characteristic impedance of the slabline. A ratio of 0.553 of the central conductor diameter to the sidewall distance for a 50Ω characteristic impedance is, for example, well known from the corresponding literature.

Depending on the thickness of the ground planes (75) and (78) of the coplanar probe, their distance to the central conductor (77) and the central conductor's width and thickness, the front end of the slabline must be tapered down and slotted in order to fit on to the probe.

The probe (79) is then inserted into the front of the slabline by sliding part (78) into slot (76), part (75) into slot (73) and part (77) into slot (74) simultaneously Good RF contact is established either by tight fitting and/or using set-screws, as follows:

Small set screws, inserted into the sidewalls (70) and (72) vertically at the positions and along the axis (80) and (81) correspondingly, allow to fix the two ground planes (75) and (78) of the coplanar probes. The central conductor can also have such a set screw at its center above the slot, but if its diameter is too small for a #080 size screw, the smallest size we recommend, then the slot on the central conductor has to be made with such accuracy, as to support a good RF contact by just sliding the central conductor of the coplanar probe in and out with the support of an appropriate tweezers tool.

This technique is based on the shown form of a coplanar probe, but is not restricted to a certain manufacturer's probe models. As long as a coplanar probe can be manufactured in this basic shape the described connection and assembly techniques apply.

B. Calibrating the Tuners with the Probes Integrated:

After assembling the probes on the tuners, the tuners must be calibrated on a network analyzer, in order to be operational for load pull and noise measurements. This requires a full set-up, including the tuner(s) (100), a probe station (98), and two probes (97), a THRU line and a DELAY line connection (98) on the semiconductor or alumina substrate (99), compatible with a TRL (Thru-Reflect Line) calibration method, which is known from the literature [1]. This said TRL method allows one to determine S-parameters of two adjacent two-ports forming a test fixture. In our case one section of the test fixture includes a tuner (100) and a probe (99) connected to the tuner (FIG. 8) and the other section includes only a probe (97). This configuration is chosen here in order to demonstrate that unsymmetrical set-ups like the one of FIG. 8 can be calibrated as well as symmetrical ones (not shown here), which would include one tuner and one probe on each side of the wafer (98).

The whole set-up is being controlled by a control computer, which uses standard GPIB communication to control the network analyzer and an internal digital interface to control the tuner motor's positions. This control computer and the standard interfaces have been used for some time in the industry and are not part of this invention, so they are not shown here, being considered "prior art".

The network analyzer (90) must be calibrated independently on coaxial reference planes (95–101). After the network analyzer calibration, the tuner (100) with its associated probe (99) and the opposite probe (97) are connected via a THRU line standard on the wafer (98). A software routine then performs a tuner calibration. This routine steps through a number of user-selected frequencies and then the tuner's horizontal and vertical motors are positioned at a number of combinations, which correspond to a user selected number of impedances on the Smith Chart, aiming at covering a maximum range of reflection factor amplitude and a full 360° of phase for the selected frequency.

At each position of the tuner motors the full S-parameters of the twoport between points (101) and (95), which includes the tuner (100), the tuner extension (102) one probe (99) connected to the tuner extension (102), one THRU line standard (98) and a second probe (97). This is possible because the network analyzer has been calibrated beforehand exactly between these two reference planes (101) and (95). The S-parameters measured at this point include a non-desired section between the THRU line standard (98) and the right hand-side reference point (95). The S-parameters of this section (98-95) are known from the previously executed TRL calibration of the set-up between points (101) and (95).

The software calibration routine executes a matrix multiplication of the actually measured parameters of the whole twoport (101-95) with the inverse matrix of the already determined and invariable parameters of the twoport (98-95). The result of this matrix multiplication (which in the industry is also called "de-embedding") is saved in a re-useable "tuner calibration file" on the computer's hard disk.

We deliberately do not use the expression S-parameters, when speaking of mathematical matrix operations in this context, because matrix multiplication to describe cascaded twoport networks is allowed only when using "transfer" or "ABCD" parameters; these terms and theorems are well known from the general literature of microwave network theory and are not repeated here. The data saved in the tuner calibration files can be re-loaded from another software application and can be used to display the tuner impedance on the Smith Chart and use the data in order to perform set-up corrected impedance related tests.

Although the present invention has been explained hereinabove by way of a preferred embodiment thereof, it should be pointed out that any modifications to this preferred embodiment within the scope of the appended claims is not deemed to alter or change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What I claim as my invention is:

1. A method of low-loss integration of at least one air-based coplanar wafer probe with a manual or automatic tuner by designing, shaping and manufacturing each respective probe in order to form a direct extension of a respective slotted transmission airline of said tuners, in a way as to eliminate any dielectrically loaded coaxial adapter or connector between a tuner test port and a device under test.

2. A method of installing, adjusting and fixing the position, adjusting the characteristic impedance, maintaining and replacing damaged or worn coplanar wafer probes on tuner slablines as described in claim 1.

3. A method of "in-situ" calibrating automatic microwave tuners permanently fitted with wafer probes as in claim 1, connected via a Thru line wafer standard in a set-up featuring one or two such tuners on a wafer probe station, flexible cables and a calibrated vector network analyzer.

* * * * *